(12) United States Patent
Lai

(10) Patent No.: US 11,798,839 B2
(45) Date of Patent: Oct. 24, 2023

(54) SEMICONDUCTOR STRUCTURE HAVING AIR GAP DIELECTRIC

(71) Applicant: NANYA TECHNOLOGY CORPORATION, New Taipei (TW)

(72) Inventor: Chun-Chi Lai, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 118 days.

(21) Appl. No.: 17/394,958

(22) Filed: Aug. 5, 2021

(65) Prior Publication Data

US 2021/0366761 A1 Nov. 25, 2021

Related U.S. Application Data

(62) Division of application No. 16/535,809, filed on Aug. 8, 2019, now Pat. No. 11,145,540.

(51) Int. Cl.
*H01L 21/768* (2006.01)
*H01L 23/532* (2006.01)
*H01L 23/522* (2006.01)

(52) U.S. Cl.
CPC .... *H01L 21/7682* (2013.01); *H01L 21/76877* (2013.01); *H01L 23/5226* (2013.01); *H01L 23/5329* (2013.01)

(58) Field of Classification Search
None
See application file for complete search history.

(56) References Cited

U.S. PATENT DOCUMENTS

| | | |
|---|---|---|
| 5,324,683 A | 6/1994 | Fitch et al. |
| 6,190,996 B1 | 2/2001 | Mouli et al. |
| 6,228,763 B1 | 5/2001 | Lee |
| 8,637,930 B2 | 1/2014 | Ando et al. |
| 8,999,837 B2 | 4/2015 | Park et al. |
| 9,337,202 B2 | 5/2016 | Lim et al. |
| 9,716,158 B1 | 7/2017 | Cheng et al. |
| 10,522,642 B2 | 12/2019 | Lee et al. |
| 10,522,649 B2 | 12/2019 | Cheng et al. |
| 10,741,654 B2 | 8/2020 | Li et al. |
| 2001/0001407 A1 | 5/2001 | You et al. |
| 2001/0007788 A1 | 7/2001 | Chang et al. |
| 2006/0094196 A1 | 5/2006 | Kim |
| 2010/0025775 A1 | 2/2010 | Giles et al. |
| 2011/0183516 A1 | 7/2011 | Lee |

(Continued)

OTHER PUBLICATIONS

"Etching Mechanism of Silicon Nitride in HF-Based Solutions" by Knotter et al. (Year: 2001).

*Primary Examiner* — Evren Seven
(74) *Attorney, Agent, or Firm* — MUNCY, GEISSLER, OLDS & LOWE, P.C.

(57) ABSTRACT

The present disclosure provides a semiconductor structure for reducing capacitive coupling between adjacent conductive features. The semiconductor structure includes a base layer, a plurality of conductive lines, a plurality of dielectric pillars, and a sealing layer having a plurality of sealing caps. The conductive lines are disposed on the base layer. The dielectric pillars are disposed on the base layer and separated from the conductive layer. The sealing caps are disposed between the conductive lines and the dielectric pillars, wherein the sealing caps are in contact with the conductive lines and the dielectric pillars, and separated from the base layer.

7 Claims, 8 Drawing Sheets

(56) References Cited

U.S. PATENT DOCUMENTS

| | | |
|---|---|---|
| 2013/0248950 A1 | 9/2013 | Kang et al. |
| 2014/0024192 A1 | 1/2014 | Kim et al. |
| 2014/0117420 A1 | 5/2014 | Chen et al. |
| 2014/0175650 A1 | 6/2014 | Singh et al. |
| 2014/0175659 A1 | 6/2014 | Lee et al. |
| 2014/0179092 A1 | 6/2014 | Kim |
| 2014/0179102 A1 | 6/2014 | Joung et al. |
| 2014/0306351 A1 | 10/2014 | Kim |
| 2015/0091089 A1 | 4/2015 | Niebojewski et al. |
| 2015/0228754 A1 | 8/2015 | Sung |
| 2016/0163816 A1 | 6/2016 | Yu et al. |
| 2018/0005876 A1 | 1/2018 | Tung et al. |
| 2019/0378909 A1 | 12/2019 | Cheng et al. |
| 2020/0020567 A1 | 1/2020 | Sun et al. |
| 2020/0075417 A1* | 3/2020 | Lee ........................ H01L 29/665 |
| 2020/0098886 A1 | 3/2020 | Liu et al. |
| 2020/0212192 A1 | 7/2020 | Xie et al. |

\* cited by examiner

SEMICONDUCTOR STRUCTURE HAVING AIR GAP DIELECTRIC

CROSS-REFERENCE TO RELATED APPLICATION

This application is a divisional application of U.S. Non-Provisional application Ser. No. 16/535,809 filed Aug. 8, 2019, which is incorporated herein by reference in its entirety.

TECHNICAL FIELD

The present disclosure relates to a semiconductor structure, and more particularly, to a semiconductor structure having air gap dielectric for reducing capacitive coupling between adjacent conductive features.

DISCUSSION OF THE BACKGROUND

As integrated circuit transistor densities increase and feature sizes shrink, capacitive coupling between adjacent interconnects, metal lines or other elements also increases. The increased capacitive coupling in turn results in higher parasitic capacitance, which undesirably slows circuit speeds and negatively impacts overall device performance.

Current attempts to improve electrical isolation in high-density integrated circuits involve the implementation of low K dielectric materials such as hydrogen silsesquioxane (HSQ), SiLK™ (a trademark of The Dow Chemical Company) resin, Black Diamond™ (a trademark of Applied Materials company) low κ film, Coral™ (a trademark of Novellus System Inc.) carbonaceous oxide film and several other exotic materials. While these materials have a relatively low dielectric constant, they are not normally used in semiconductor manufacturing and therefore increase manufacturing complexity and costs. Much work remains to effectively integrate these materials into conventional semiconductor manufacturing processes. Some disadvantages of current low κ materials include incompatible thermal coefficient of expansion, low mechanical strength and poor thermal diffusivity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

To address the problems previously described, one aspect of the present disclosure provides a semiconductor structure. In one aspect of the present disclosure, the semiconductor structure comprises a base layer; a plurality of conductive lines disposed on the base layer; a plurality of dielectric pillars disposed on the base layer, separated from the conductive layer; and a sealing layer having a plurality of sealing caps disposed between the conductive lines and the dielectric pillars, wherein the sealing caps are in contact with the conductive lines and the dielectric pillars, and separated from the base layer.

In some embodiments, the semiconductor structure further comprises a plurality of air gaps respectively correspondingly positioned between the conductive lines and the dielectric pillars.

In some embodiments, the plurality of sealing caps occupy top portions of the plurality of air gaps.

In some embodiments, a bottom end of the plurality of sealing caps is lower than a top end of the plurality of conductive lines.

In some embodiments, a bottom end of the plurality of sealing caps is lower than a top end of the plurality of dielectric pillars.

In some embodiments, a bottom width of the air gap is greater than a top width of the air gap.

In some embodiments, a top width of the dielectric pillar is greater than a bottom width of the dielectric pillar.

In some embodiments, a top end of the dielectric pillars is lower than a top end of the conductive lines.

Another aspect of the present disclosure provides a method of preparing a semiconductor structure. In some embodiments of the present disclosure, the method of preparing the semiconductor structure comprises the steps of providing a base layer; forming a plurality of conductive lines on the base layer; forming a plurality of spacers on the base layer, wherein each of the conductive lines are flanked by the spacers; forming a plurality of dielectric pillars on the base layer, between the spacers; removing the spacers; and forming a plurality of sealing caps between the conductive lines and the dielectric pillars, wherein the sealing caps are in contact with the conductive lines and the dielectric pillars, and separated from the base layer.

In some embodiments, the method further comprises the step of forming a plurality of plugs in the base layer before the step of forming the conductive lines on the base layer, wherein the conductive lines are connected to the plugs.

In some embodiments, the step of forming the conductive lines on the base layer comprises forming a conductive layer (FIG. 6, 120*a*) on the base layer; and patterning the conductive layer to form the conductive lines.

In some embodiments, the spacers comprise silicon oxide.

In some embodiments, the step of removing the spacers comprises etching the spacers with vapor hydrofluoric acid.

In some embodiments, the step of forming the spacers comprises: forming a spacer layer on the base layer and the conductive lines; and partly removing of the spacer layer to form the spacers.

In some embodiments, partly removing the spacer layer comprises anisotropic etching.

In some embodiments, the dielectric pillars comprise hydrogen silsesquioxane, cyclotene, poly(arylene ether) or silicon oxide.

In some embodiments, the step of forming the dielectric pillars comprises spin-coating.

In some embodiments, the step of forming the dielectric pillars comprises: filling a dielectric material between the spacers; and drying the dielectric material to form the dielectric pillars.

In some embodiments, the step of forming the sealing caps comprises spin-coating.

In some embodiments, after forming a plurality of dielectric pillars, a top end of the dielectric pillars is lower than a top end of the conductive lines, and a top portion of the spacer is exposed.

The semiconductor structure disclosed in the present disclosure has gaps between the conductive lines and the dielectric pillars, and the sealing caps seal the gap from the top to form enclosed air gaps. Since air is a dielectric material with considerably low dielectric constant, the resultant air gap-dielectric pillar combination between the conductive lines provides a dielectric structure with lower dielectric constant than prior arts. In some embodiments, the dielectric pillars can be manufactured with conventional materials, so the dielectric constant can be lowered while preventing using unfamiliar materials. Thus, the semiconductor structure provided in the present disclosure can reduce the unwanted parasitic capacitance without extensive research and development. As a result, a device using the provided semiconductor structure has an enhanced performance and reasonable cost Since conventional materials can be used to form the dielectric pillars in the present disclosure, the method of preparing the semiconductor structure is highly compatible with prior art. That is to say, no new equipment or techniques are required for manufacturing the low κ semiconductor structure.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
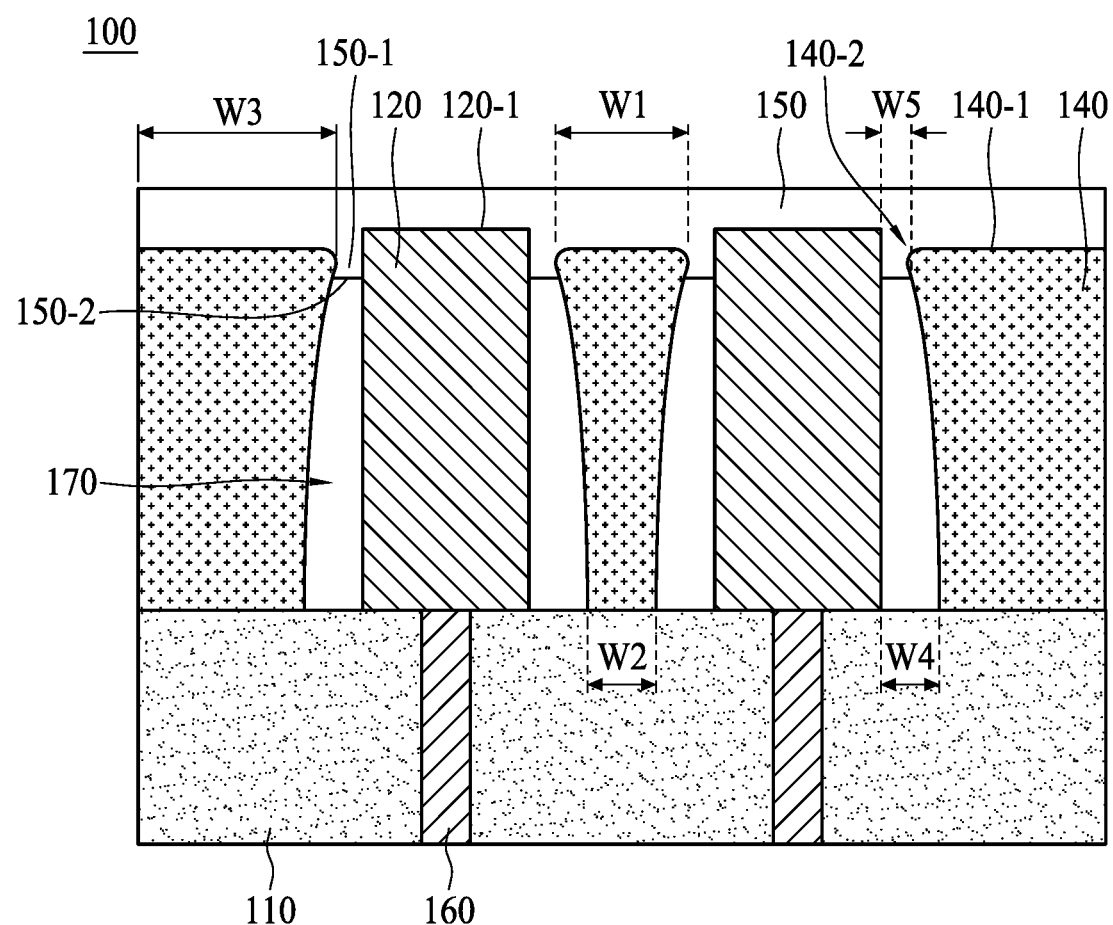
FIG. 1 is a sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a sectional view of a semiconductor structure 100 in accordance with some embodiments of the present disclosure. Please refer to FIG. 1, the semiconductor structure 100 includes a base layer 110. In some embodiments, the base layer 110 may be a silicon substrate, such as a crystalline silicon. In some other embodiments, the base layer 110 may be an inter-layer dielectric, such as borophosphorus silica glass (BPSG).

The semiconductor structure 100 also includes a plurality of dielectric pillars 140, a plurality of conductive lines 120, and a sealing layer 150 having a plurality of sealing caps 150-1. The conductive lines 120 and the dielectric pillars 140 are disposed on the base layer 110, apart from each other. In some embodiments, the conductive lines 120 may be aluminum or tungsten. In another embodiment, the dielectric pillars 140 may be spin-on dielectric (SOD). The sealing caps 150-1 are disposed between the conductive lines 120 and the dielectric pillars 140. In some embodiments, the sealing caps 150-1 may be SOD or spin-on glass (SOG). The sealing caps is in contact with the conductive lines 120 and the dielectric pillars 140, while keeping a distance from the base layer 110. The base layer 110, the sealing caps 150-1, the conductive lines 120, and the dielectric pillars 140 therefore form enclosed air gaps 170. The base layer 110 may further include plugs 160, which are buried in the base layer 110. The plugs 160 are connected to the conductive lines 120 and the other side of the base layer 110.

The sealing caps 150-1 sealed the gap between the conductive lines 120 and the dielectric pillars 140 from the top to form an enclosed air gaps 170 so even there are further manufacturing steps of forming other structures over the semiconductor structure 100, the space will be maintained. Since air is an insulator with rather low κ, the combination of dielectric pillars 140 and air gaps 170 can be an ideal dielectric structure compare to the prior art. In some embodiments, the top width W1 of the dielectric pillar 140 is greater than the bottom width W2 of the dielectric pillar 140. In some embodiments, the width W2 of the dielectric pillar 140 at one side (right side) of the conductive lines 120 is different from (less than) the width W3 at another side (left side) of the conductive lines 120. In some embodiments, the bottom width W4 of the air gap 170 is greater than the top width W5 of the air gap 170. In some embodiments, the dielectric pillars 140 have rounding corners 140-2.

In some embodiments, the sealing caps 150-1 partially occupying the top portions of the air gaps 170. In some embodiments, the bottom end 150-2 of the sealing caps 150-1 is lower than the top end 120-1 of the conductive lines 120. In some embodiments, the bottom end 150-2 of the sealing caps 150-1 is lower than the top end 140-1 of the dielectric pillars 140. In some embodiments, the sealing caps 150-1 is integrally formed with the sealing layer 150 to prevent the sealing layer 150 from peeling off from the conductive lines 120 and the dielectric pillars 140.

Figure 2:
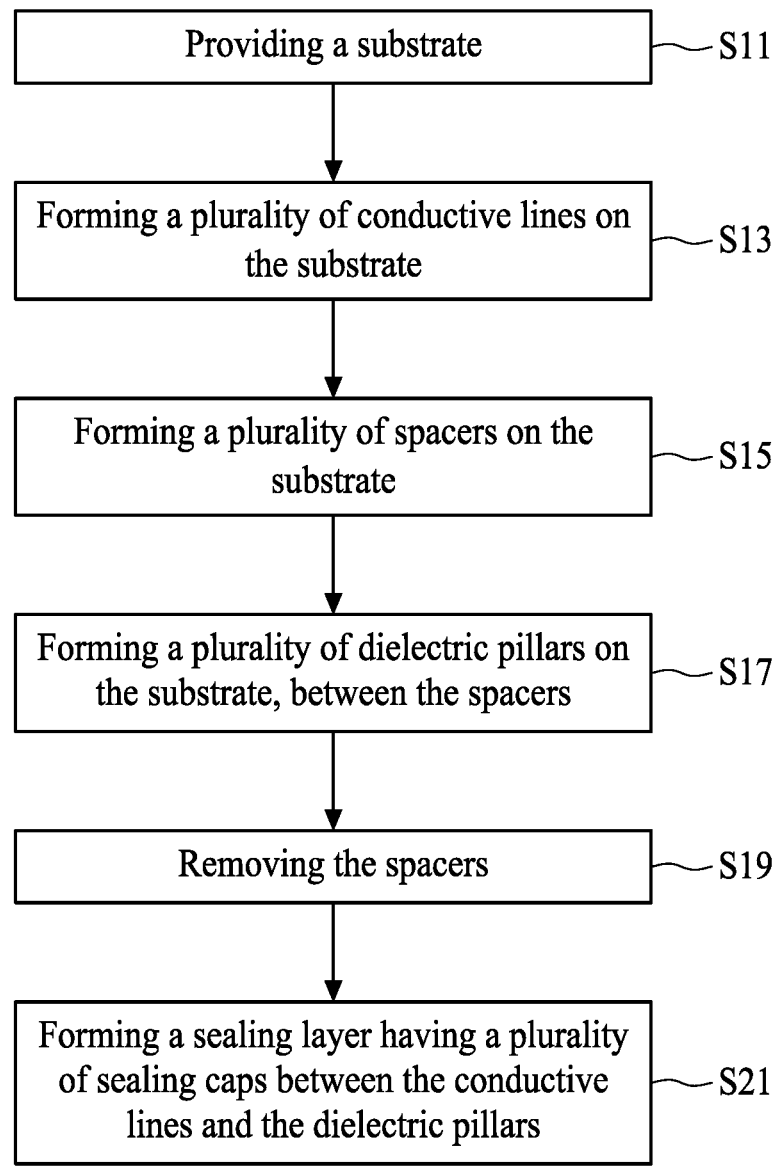
FIG. 2 is a flow diagram of a method of preparing a semiconductor structure in accordance with some embodiments of the present disclosure.
Figure 3:
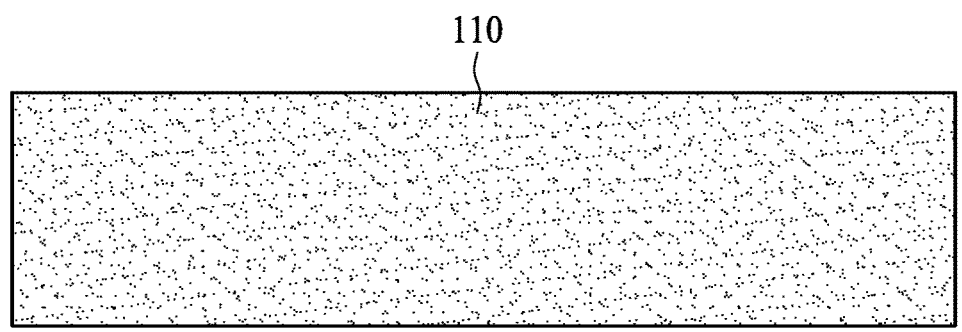
FIGS. 3 to 14 illustrate, in schematic cross-sectional diagrams, a flow of preparing the semiconductor structure in FIG. 1 in accordance with some embodiments of the present disclosure.
Figure 4:
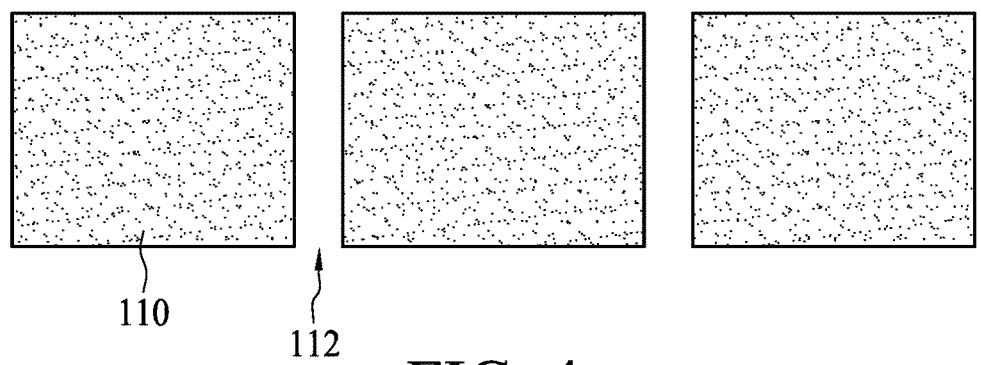
Figure 5:
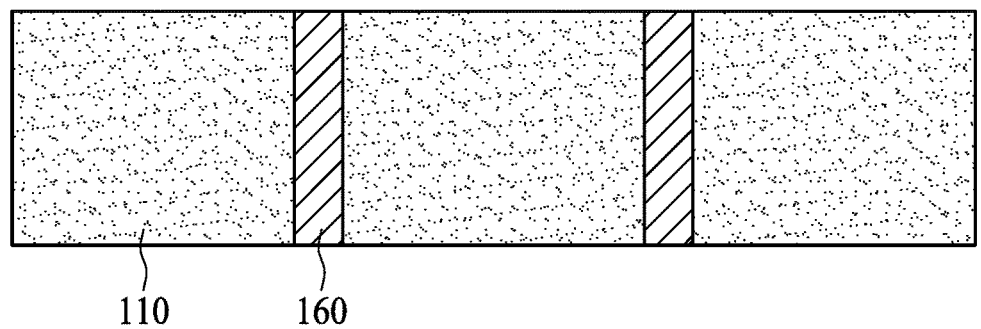

FIG. 2 is a flow diagram of the method 10 of preparing the semiconductor structure 100 in FIG. 1 in accordance with some embodiments of the present disclosure, and FIGS. 3 to 14 illustrate, in schematic cross-sectional diagrams, a flow of preparing the semiconductor structure 100 in accordance with some embodiments of the present disclosure. Please refer to FIG. 2 and FIG. 3 for the method 10 of preparing the semiconductor structure 100 in accordance to some embodiments of the present disclosure. In the first step S11, a base layer 110 is provided. The base layer 110 can be a silicon substrate or an inter-layer dielectric. In some embodiments, the base layer 110 has a plurality of plugs 160. Please referred to FIG. 4 and FIG. 5. In some embodiments, the formation of the plugs 160 may include the step of forming plug contact holes 112. The plug contact holes 112 may be formed by etching the base layer 110 with, for example, buffered oxide etchant (BOE). Next, a plug layer (not shown) can be formed in the plug contact holes 112 and on the base layer 110.

In some embodiments, a hard mask layer (not shown) is formed on the base layer 110 and a photoresist pattern (not shown) for defining the plug contact holes 112 is formed on the hard mask layer. For example, the hard mask layer may be configured in a stacked form of an amorphous carbon layer (ACL) and a SiON layer. The hard mask layer is then etched using the photoresist pattern as an etch mask, so that a hard mask pattern (not shown) is formed. Subsequently, the photoresist pattern is removed, and the base layer 110 is etched using the hard mask pattern as an etch mask to form the plug contact holes 112.

In some embodiments of the present disclosure, the plug layer may be a tungsten layer, which is deposited on the base layer 110 with chemical vapor deposition (CVD). An intermediate layer, for example TiN layer, can be formed on the base layer 110 and in the plug contact holes 112 before the tungsten layer. The plug layer is then etched to remove the plug layer on the base layer 110 so only the plug layer in the plug contact holes 112 is remained and thus form the plugs 160. In the embodiment wherein the plug layer is a tungsten layer, reactive ion etching (RIE) can be performed with a fluorine-containing gas such as sulfur hexafluoride ($SF_6$). Sulfur hexafluoride reacts with the tungsten to form a tungsten fluoride gas which is vented away.

In some embodiments, the tungsten etch back can be performed in two stages. First, adjust the etching condition of $SF_6$+Ar RIE plasma to high W:TiN etch rate selectivity (preferably higher than 30:1, even 70:1) and perform the tungsten etch back. Next, after the tungsten on the TiN is removed, adjust the etching condition to high TiN:W etch rate selectivity to remove of the TiN on the base layer 110. The etch back can also be performed by chemical mechanical polish (CMP) since tungsten:silicon dioxide selectivity is high. In some embodiments of the present disclosure, the plug layer can be selectively removed by CMP with oxidant such as potassium ferricyanide ($K_3Fe(CN)_6$), ferric nitrate ($Fe(NO_3)_3$), potassium iodate ($KIO_3$), and hydrogen peroxide $H_2O_2$. The particle size of the CMP slurry may be 100-500 nm, and the pH may be controlled under 4 to facilitate the oxidation of tungsten.

Figure 6:
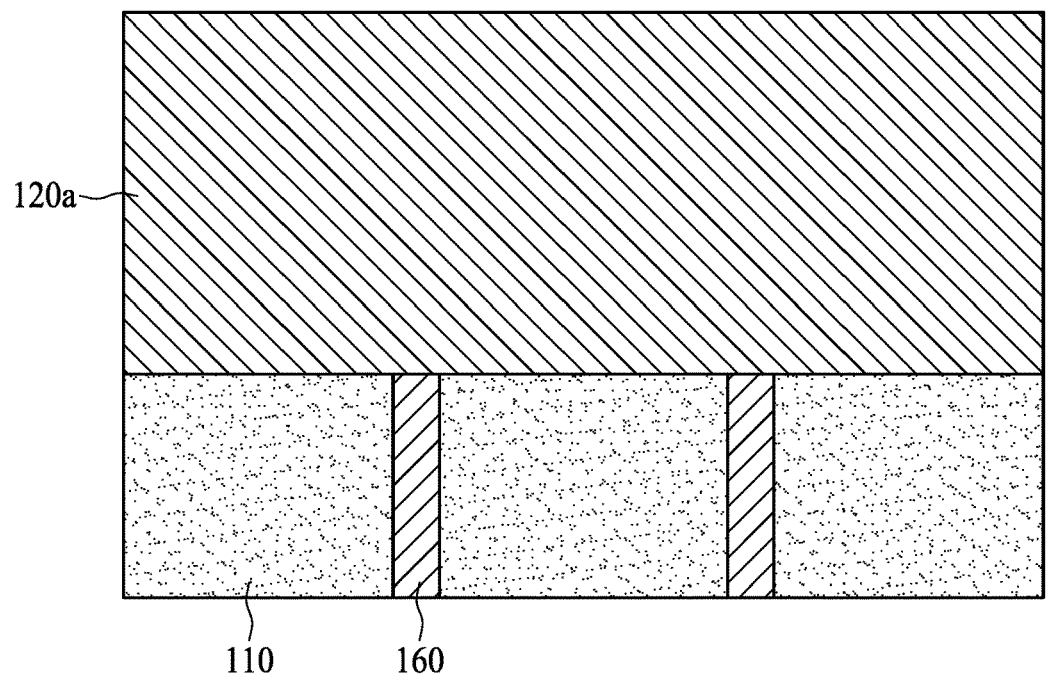
Figure 7:
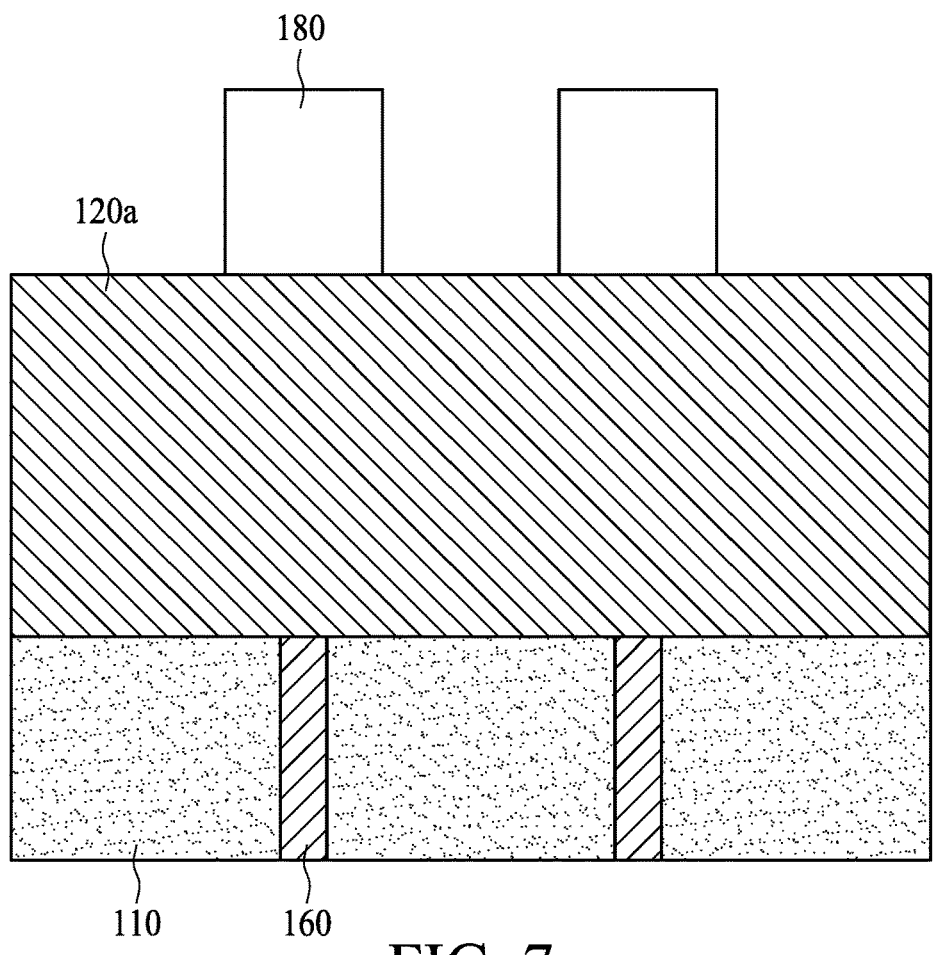
Figure 8:
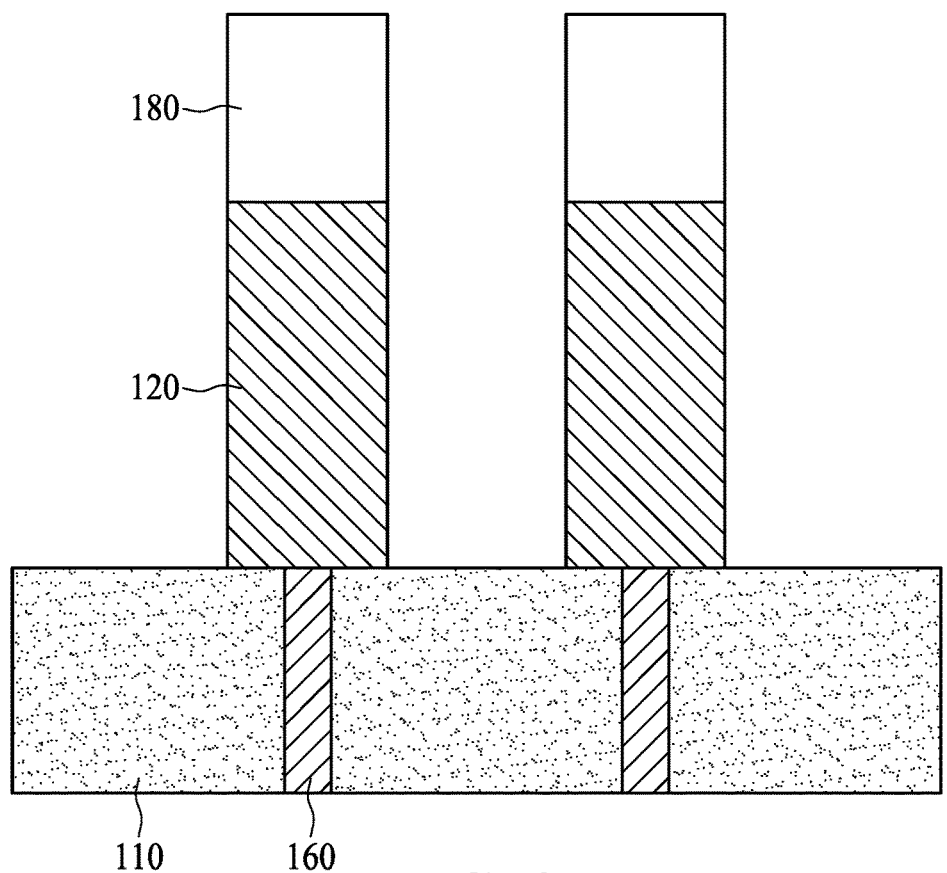

Next, please refer to FIG. 6 to FIG. 9. In step S13, a plurality of conductive lines 120 are formed on the base layer 110. The formation of the conductive lines 120 can be further divided into the following steps. First, a conductive layer 120a is formed on the base layer 110 and connected to the plugs 160, as shown in FIG. 6. In some embodiments, the conductive layer 120a may be aluminum, tungsten or copper, and can be formed by CVD or physical vapor deposition (PVD) such as sputtering.

Figure 9:
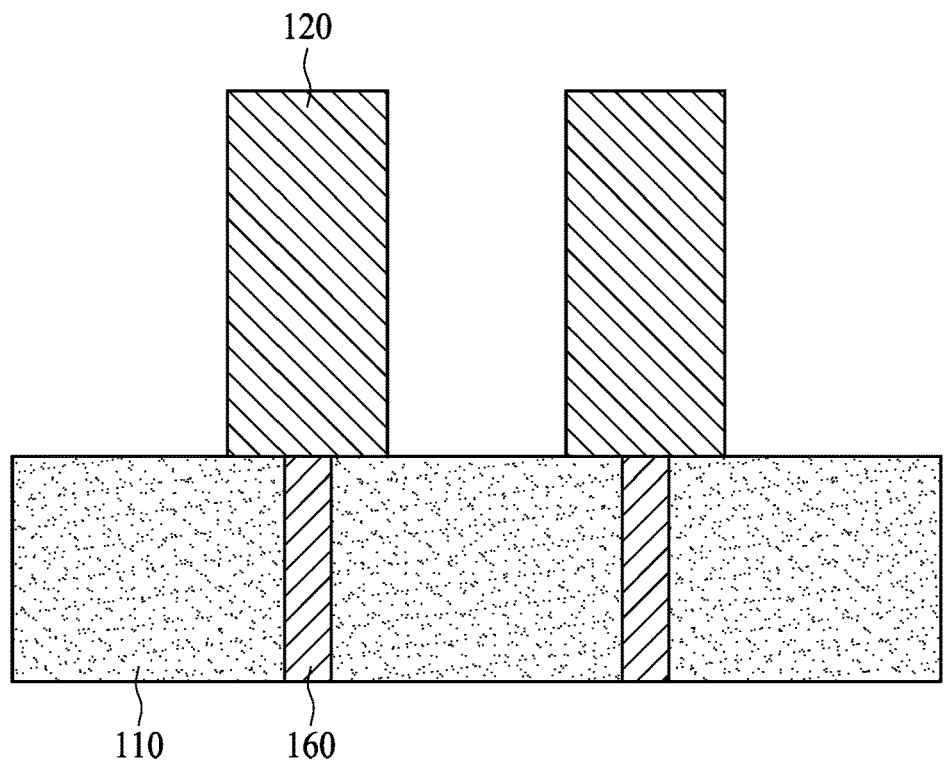

Subsequently, the conductive layer 120a is patterned to form the conductive lines 120. Please refer to FIG. 7, in some embodiments, the pattering of the conductive layer 120a can be a photolithography process. For example, a hard mask layer (not shown) is formed on the base layer 110 and a photoresist pattern (not shown) for defining the conductive lines 120 is formed on the hard mask layer. In such case, the hard mask layer may be configured in a stacked form of ACL and a SiON layer, for example. The hard mask layer is then etched using the photoresist pattern as an etch mask, so that a hard mask pattern 180 is formed. Subsequently, please refer to FIG. 8, the photoresist pattern is removed, and the conductive layer 120a is etched using the hard mask pattern 180 as an etch mask, such that the conductive lines 120 connected to the plugs 160 are formed on the base layer 110. The etching process can be an RIE using chloride in the embodiments where the conductive layer 120a may be aluminum. The hard mask pattern 180 is then removed, as shown in FIG. 9.

Figure 10:
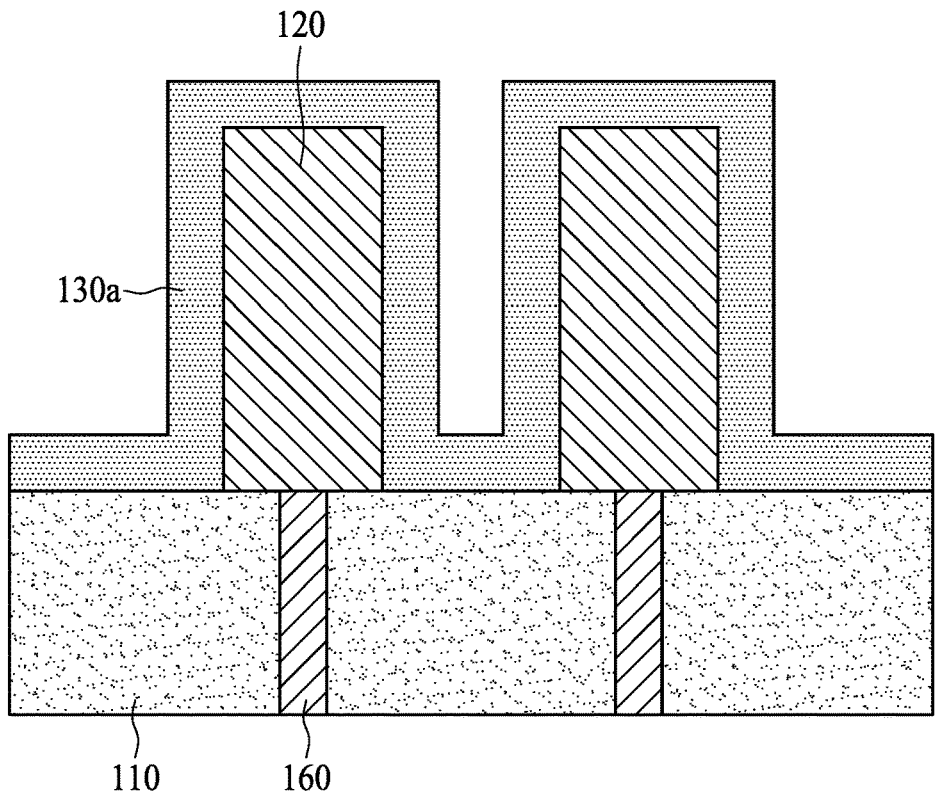
Figure 11:
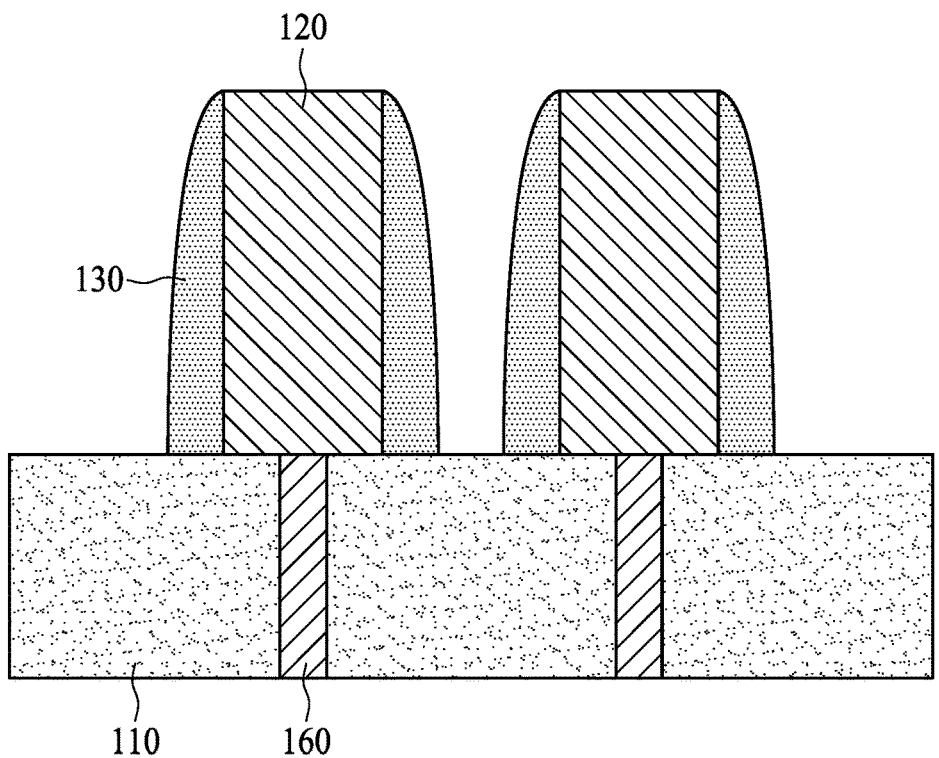

Next, please refer to FIG. 10 and FIG. 11, in step S15, the spacers 130 are formed flanking the conductive lines 120. In some embodiments, the formation of the spacers 130 includes forming a spacer layer 130a on the base layer 110 and the conductive lines 120, covering the top and the sides of the conductive lines 120, as shown in FIG. 10. In some embodiments of the present disclosure, the spacer layer 130a may be silicon oxide or doped silicon oxide. In such embodiment, the spacer layer 130a can be formed by LPCVD with tetraethyl orthosilicate (TEOS), which produces silicon oxide under high temperature. The spacer layer 130a can then be etched to form the spacers 130. In some embodiments, the etching is an anisotropic etching process such as dry etching with plasma. The anisotropic etching process etches away the horizontal part of the spacer layer 130a on the base layer 110 and on the top surface of the conductive lines 120, but only partly remove the vertical part of the spacer layer 130a flanking the side of the conductive lines 120 so that the remaining spacer layer 130a forms the spacers 130, as shown in FIG. 11.

Figure 12:
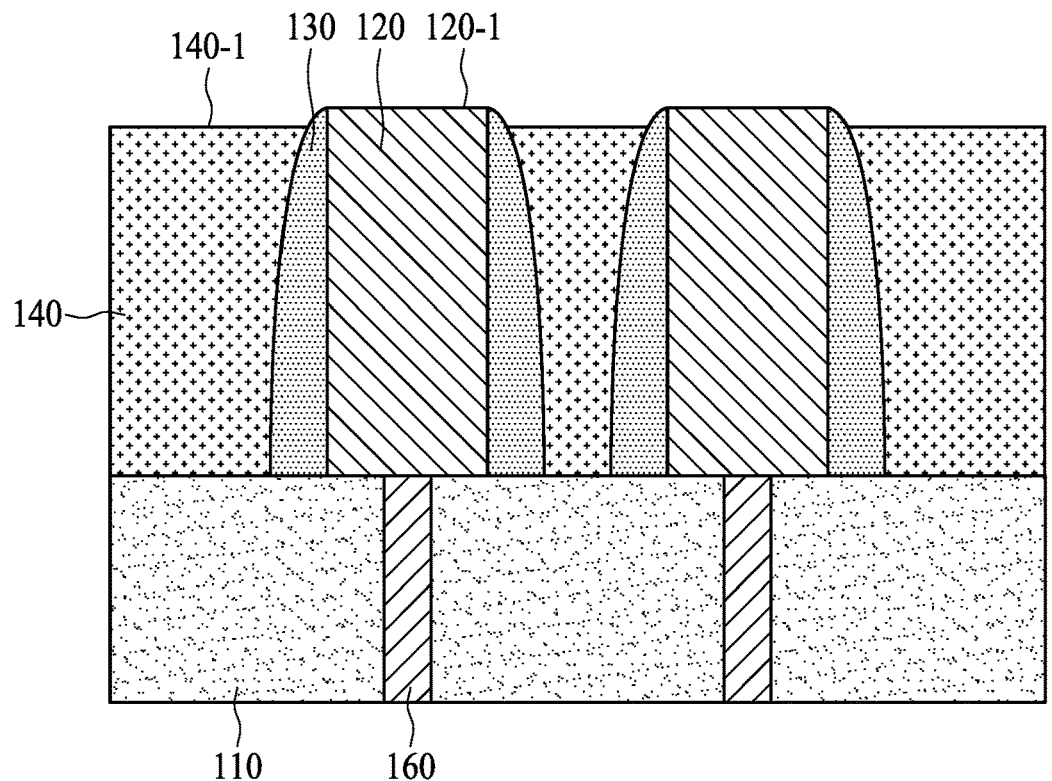

Please refer to FIG. 12. Next, in step S17, a plurality of dielectric pillars 140 are formed on the base layer 110. In some embodiments, the dielectric pillars 140 are formed by spin coating. In some embodiments, the top end 140-1 of the dielectric pillars 140 is lower than the top end 120-1 of the conductive lines 120, and the top portion of the spacers 130 is exposed.

In some embodiments, the dielectric pillars 140 may be hydrogen silsesquioxane, cyclotene, poly(arylene ether), aerogel of silicon oxide, or xerogel of silicon oxide. In some other embodiments, the dielectric pillars 140 formed by first filling a dielectric material between the spacers 130 and then dry or cure the dielectric materials to form the dielectric pillars 140. For example, where silica gels are used for forming the dielectric pillars 140, the flowable dielectric material, namely TEOS with solvent, is dispensed on the center of the semiconductor structure 100 on a spin coater (not shown). The semiconductor structure 100 is then rotated at high speed to spread the dielectric material by centrifugal force. Since the dielectric material is flowable, it can easily fill between the spacers. Rotation is continued while the dielectric material spins off the edges of the semiconductor structure 100, until the desired thickness of the dielectric material is achieved. The thickness of the dielectric material can be controlled by the angular speed of the spinning. The thickness also depends on the viscosity and concentration of the dielectric material. In such embodiments, the dielectric material need to be cured to form the dielectric pillars 140. If the dielectric material is dried by evaporation, then the dielectric pillars 140 is silica xerogel; if the dielectric material is dried by supercritical drying, then the dielectric pillars 140 is silica aerogel.

Figure 13:
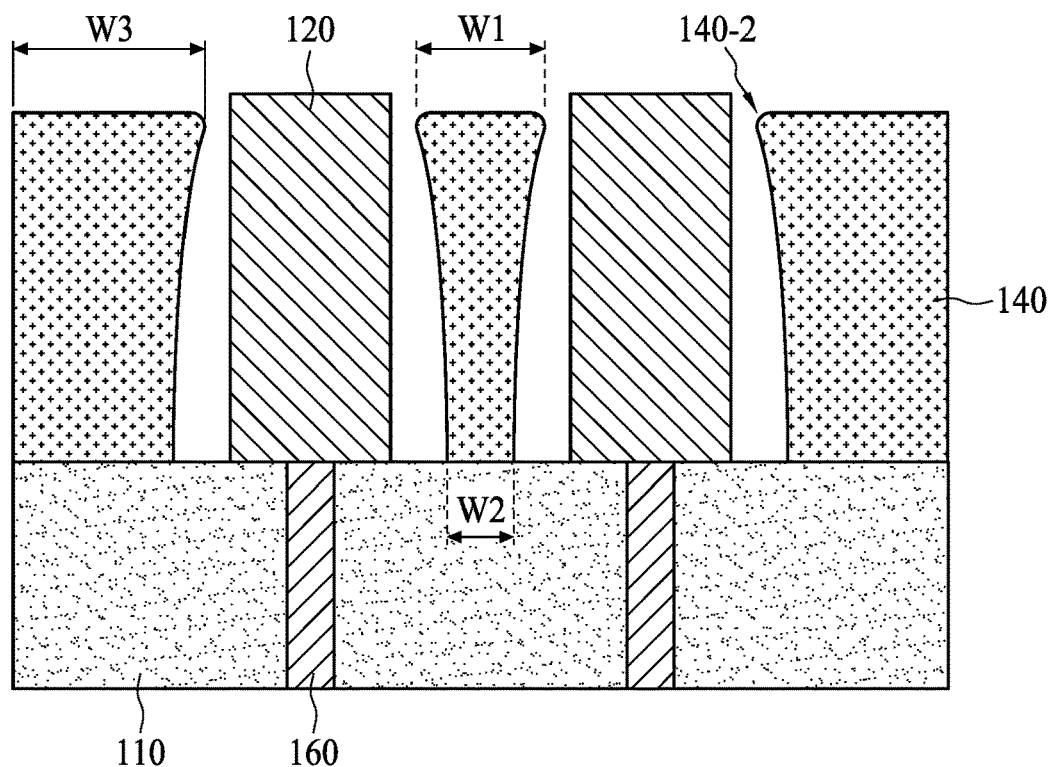

Next, please refer to FIG. 13. In step S19, the spacers 130 are removed. In some embodiments, the spacers 130 can be removed by an etching process. For example the spacers 130 maybe doped silicon dioxide, and the spacers 130 can be removed by etching the spacers 130 with vapor hydrofluoric acid (VHF). Since VHF is highly corrosive to silicon dioxide but only mildly etch metal, the use of VHF may effectively remove the spacers 130 while not damaging the remaining of the semiconductor structure 100 such as the conductive lines 120 if, for example, the conductive lines 120 is made of metal. In some embodiments, after removing the spacers 130 by VHF, the dielectric pillars 140 have rounding corners 140-2.

In some embodiments, after removing the spacers 130, the top width W1 of the dielectric pillar 140 is greater than the bottom width W2 of the dielectric pillar 140. In some embodiments, the width W2 of the dielectric pillar 140 at one side (right side) of the conductive lines 120 is different from (less than) the width W3 at another side (left side) of the conductive lines 120.

Figure 14:
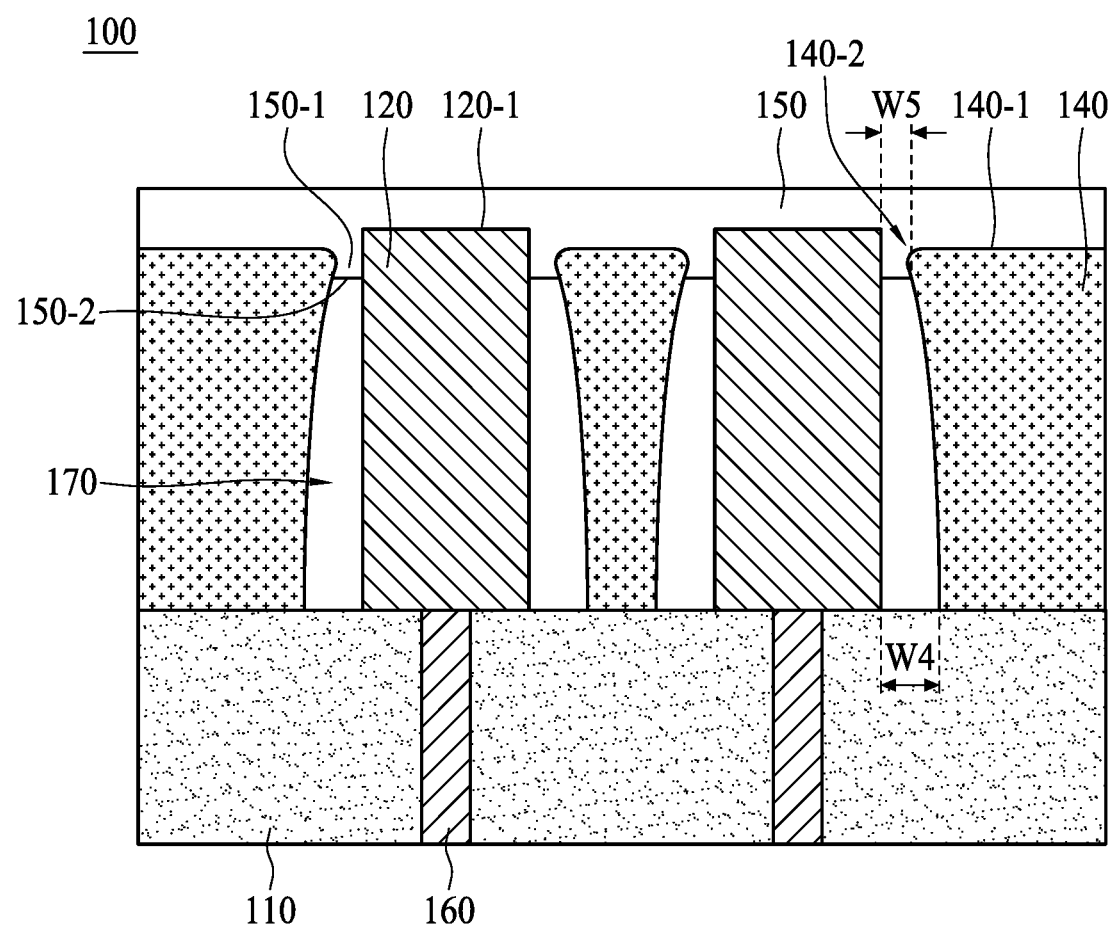

Please refer to FIG. 14. In the last step, step S21, a sealing layer 150 is formed over the dielectric pillars 140 and the conductive lines 120, wherein the sealing layer 150 has a plurality of sealing caps 150-1 between the dielectric pillars 140 and the conductive lines 120. The sealing caps 150-1 are in contact with both the dielectric pillars 140 and the conductive lines 120, but keeping a distance from the base layer 110 and therefore create an enclosed air gaps 170 surrounded by the sealing caps 150-1, the conductive lines 120, the base layer 110, and the dielectric pillars 140. In some embodiments, the bottom width W4 of the air gap 170 is greater than the top width W5 of the air gap 170.

In some embodiments, the sealing caps 150-1 can be SOD or SOG. The process of forming SOD sealing caps 150-1 is similar to the abovementioned SOD dielectric pillars 140, except the dielectric material is filled in between the conductive lines 120 and the dielectric pillars 140 instead of between the previously removed spacers 130. In some embodiments, where SOG sealing caps 150-1 are used, the spinning and coating steps are similar to the forming of the SOD dielectric material, except the flowable precursor (not shown) is prepared by mixing silicate or siloxane (instead of TEOS) with solvent such as alcohol or ketone. When silicate is used, $P_2O_5$ can be added to prevent cracks in the resultant sealing caps 150-1. The flowable precursor need to be cured to evaporate the solvent to form the sealing caps 150-1. In some embodiments, the semiconductor structure 100 can be heated on a hot plate (not shown) to drive the solvent out of the flowable precursor and to bring about the formation of the Si—O bond in the flowable precursor.

In summary, the semiconductor structure 100 has an air gaps 170 between the conductive lines 120 and the dielectric pillars 140, which is sealed by the sealing caps 150-1 from the top. The air in the air gaps 170 can function as a considerably low κ dielectric material. The air gaps 170 combine with the dielectric pillars 140 to form dielectric structures between the conductive lines 120, which possess the advantages of the low dielectric constant of the air the structural support provided by the dielectric pillars 140. The sealing caps 150-1 prevent the air gaps 170 from being contaminated by other materials formed on the semiconductor structure 100 in further manufacturing steps.

In some embodiments, the method of manufacturing provided in the present disclosure uses VHF to remove the doped silicon oxide spacers 130. Since VHF is a highly selective etchant to silicon dioxide, the spacers 130 can be removed effectively without sabotaging the other part of the semiconductor structure 100, namely the dielectric pillars 140 and the conductive lines 120, if the materials are carefully chosen, which facilitates the method of preparing the semiconductor structure 100.

Also, the steps in the method of preparing the semiconductor structure 100 provided in the present disclosure are compatible with the prior art. More specifically, in some embodiments, the material used to form the dielectric pillars 140 and the sealing caps 150-1 are of conventional SOG or SOD, therefore the method of preparing the semiconductor structure 100 does not need to employ experimental new manufacturing steps. Thus, the method provided in the present disclosure can produce a semiconductor structure 100 with lower dielectric constant and hence lower parasitic capacitance without dramatically increasing the cost of research and development, which results in a product with higher reliability and reasonable price.

In some embodiments, the present disclosure provides a semiconductor structure including a base layer, a plurality of conductive lines, a plurality of dielectric pillars, and a plurality of sealing caps. The conductive lines are disposed on the base layer. The dielectric pillars are disposed on the base layer and separated from the conductive layer. The sealing caps are disposed between the conductive lines and the dielectric pillars, wherein the sealing caps are in contact with the conductive lines and the dielectric pillars, and separated from the base layer.

In another embodiment, the present disclosure provides a method of preparing a semiconductor structure including the following steps: providing a base layer; forming a plurality of conductive lines on the base layer; forming a plurality of spacers on the base layer, wherein each of the conductive lines are flanked by the spacers; forming a plurality of dielectric pillars on the base layer, between the spacers; removing the spacers; and forming a plurality of sealing caps between the conductive lines and the dielectric pillars. The sealing caps are in contact with the conductive lines and the dielectric pillars, and separated from the base layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
    a base layer;
    a plurality of conductive lines disposed on the base layer;
    a plurality of dielectric pillars, disposed on the base layer, separated from the conductive layer and each of the plurality of dielectric pillars has rounding corners; and
    a sealing layer having a plurality of sealing caps, disposed between the conductive lines and the dielectric pillars, wherein the sealing caps are in contact with the conductive lines and the dielectric pillars, and separated from the base layer, wherein top portions of the plurality of conductive lines and the rounding corners of the plurality of dielectric pillars are embedded in the plurality of sealing caps.

2. The semiconductor structure of claim 1, further comprising a plurality of air gaps respectively correspondingly positioned between the plurality of conductive lines and the plurality of dielectric pillars.

3. The semiconductor structure of claim 2, wherein the plurality of sealing caps occupy top portions of the plurality of air gaps.

4. The semiconductor structure of claim 2, wherein a bottom end of the plurality of sealing caps is lower than a top end of the plurality of conductive lines.

5. The semiconductor structure of claim 2, wherein a bottom end of the plurality of sealing caps is lower than a top end of the plurality of dielectric pillars.

6. The semiconductor structure of claim 2, wherein a bottom width of the air gap is greater than a top width of the air gap.

7. The semiconductor structure of claim 1, wherein a top end of the plurality of dielectric pillars is lower than a top end of the plurality of conductive lines.

* * * * *